United States Patent
Tanase

(10) Patent No.: US 7,050,382 B2
(45) Date of Patent: May 23, 2006

(54) SEMICONDUCTOR LASER DRIVE CIRCUIT

(75) Inventor: Hironobu Tanase, Kanagawa (JP)

(73) Assignee: Sony Corporation, Tokyo (JP)

( * ) Notice: Subject to any disclaimer, the term of this patent is extended or adjusted under 35 U.S.C. 154(b) by 231 days.

(21) Appl. No.: 10/471,609

(22) PCT Filed: Jan. 23, 2003

(86) PCT No.: PCT/JP03/00608

§ 371 (c)(1),
(2), (4) Date: Sep. 24, 2003

(87) PCT Pub. No.: WO03/067584

PCT Pub. Date: Aug. 14, 2003

(65) Prior Publication Data

US 2004/0114486 A1    Jun. 17, 2004

(30) Foreign Application Priority Data

Jan. 25, 2002    (JP)    ............................. 2002-017719

(51) Int. Cl.
*G11B 7/00*    (2006.01)
(52) U.S. Cl. ...................................... 369/116
(58) Field of Classification Search ............... 369/116, 369/47.3, 47.19, 47.51; 372/31, 38.02
See application file for complete search history.

(56) References Cited

U.S. PATENT DOCUMENTS

| | | | | |
|---|---|---|---|---|
| 5,025,447 A | * | 6/1991 | Ohashi | 372/31 |
| 5,264,692 A | * | 11/1993 | Schmid et al. | 250/205 |
| 5,956,313 A | * | 9/1999 | Maegawa et al. | 369/53.26 |
| 6,011,768 A | * | 1/2000 | Taguchi | 369/116 |
| 6,442,118 B1 | * | 8/2002 | Hoshino et al. | 369/47.3 |

FOREIGN PATENT DOCUMENTS

| | | |
|---|---|---|
| JP | 8-96394 | 4/1996 |
| JP | 11-354893 | 12/1999 |
| JP | 2001-36187 | 2/2001 |

* cited by examiner

*Primary Examiner*—Paul W. Huber
(74) *Attorney, Agent, or Firm*—Oblon, Spivak, McClelland, Maier & Neustadt, P.C.

(57) ABSTRACT

A semiconductor laser drive circuit of the present invention reduces the number of wires, solves the out-of-timing problem of pulses due to differences in wire length, and emit short light pulses at a high transfer rate. A common emitter circuit (18) converts a voltage signal (J1) input at an input port (18a) into a current signal and, when reading information, adds the current signal to a signal output from a high-frequency oscillator circuit (20). High frequency components of the current signal converted from the voltage signal (J1) within a bandwidth of a transistor (Q6) are boosted. Degradation of the output signal of the high-frequency oscillator circuit (20) is kept at a minimum by a common base circuit including the transistor (Q6). A current switch circuit (16) cuts off or lets through the output current of a current mirror circuit (12).

17 Claims, 6 Drawing Sheets

INPUT

SEMICONDUCTOR LASER DRIVE CIRCUIT

TECHNICAL FIELD

The present invention relates to semiconductor laser drive circuits incorporated and used in optical disk drives for writing, erasing, and reading information from optical disks by irradiating the optical disks with laser light.

BACKGROUND ART

Semiconductor lasers in optical disk drives are used to read information from optical disks and, in the case of rewritable optical disks including phase-change optical disks, known as CD-RW, to write information to such optical disks.

The output level of laser light of such semiconductor lasers is switched depending on whether to write, read, or erase information on optical disks. For example, when reading information, a semiconductor laser irradiates an optical disk with laser light at an output level lower than that when writing information. The semiconductor laser thus reads information without destructing a written pit on the optical disk.

Laser light used to irradiate an optical disk to read information from the optical disk is reflected from the optical disk into a photo-electric converter. At the same time, part of the reflected light is incident on the semiconductor laser serving as the light source. As a result, this feedback light and the irradiating light interfere with each other to generate scoop noise and mode hopping noise. This causes degradation of the C/N ratio of a read signal.

A known drive circuit for a semiconductor laser uses a high frequency (HF) superimposing method to superimpose an HF current at 200 MHz to 600 MHz on a drive current for the semiconductor laser, thus reducing noise.

When writing information to an optical disk, a method is used in which an output of the semiconductor laser is subjected to pulse-width modulation (PWM) and then to intensity modulation to increase the density of information written to the optical disk and to increase the information transfer rate. In this method, the intensity of the laser light must be switched between a plurality of levels. Higher the transfer rate, shorter the minimum pulse width of the laser light (such as a few nanoseconds).

To satisfy these requirements, it is essential that the response speed of the semiconductor laser drive circuit be high. In other words, a broadband semiconductor laser drive circuit is necessary.

A semiconductor laser drive circuit for use in a known phase-change optical disk or the like tends to reduce the capacitance parasitic on the outputs of pulse current sources in the case of a method of adding the pulse current sources at an input terminal of the semiconductor laser or to narrow the bandwidth in the case of the HF superimposing method for reducing scoop noise caused by feedback laser light by a coupling capacitor disposed between the input terminal of the semiconductor laser and the output of an HF oscillator. As a result, the response speed tends to become slower. Since a laser driver is integrated with a waveform generator, many signals must be supplied to control the driving of the semiconductor laser. Upon transmission of a plurality of pulse signals, these pulse signals go out of timing due to differences in wire length. This problem is very difficult to alleviate. The circuit configuration is more complicated than that of a circuit including only the drive, and the number of elements is thus increased. Therefore, the semiconductor laser drive circuit has large power consumption and is disadvantageous in terms of heat dissipation.

In order to solve the above-described problems of the related art, it is an object of the present invention to reduce the number of wires to solve the problem of out-of-timing pulses due to differences in wire length and to emit light pulses with a shorter emission time at a high transfer rate. It is another object of the present invention to provide a semiconductor laser drive circuit for switching between a low-noise laser and a high-output laser.

DISCLOSURE OF INVENTION

In order to achieve the foregoing objects, the present invention provides a semiconductor laser drive circuit incorporated and used in an optical disk drive for writing, erasing, and reading information from an phase-change optical disk by irradiating the optical disk with laser light. The semiconductor laser drive circuit includes a waveform generator for generating an electrical signal for generating laser light associated with writing, erasing, and reading when writing, erasing, and reading information; a single-system line for outputting the electrical signal form the waveform generator; and a laser driver for driving a semiconductor laser by supplying, to the semiconductor laser, current in proportion to the electrical signal output through the single-system line.

In the semiconductor laser drive circuit of the present invention, the waveform generator generates the electrical signal for generating the laser light associated with writing, erasing, and reading when writing, erasing, and reading information. The laser driver supplies the current in proportion to the electrical signal output through the single-system line to the semiconductor laser and drives the semiconductor laser.

Accordingly, the number of wires is reduced, and the problem of out-of-timing pulses due to differences in wire length is solved. Light is thus emitted with a shorter emission time at a high transfer rate.

BEST MODE FOR CARRYING OUT THE INVENTION

With reference to the drawings, embodiments of the present invention will now be described.

Figure 1:
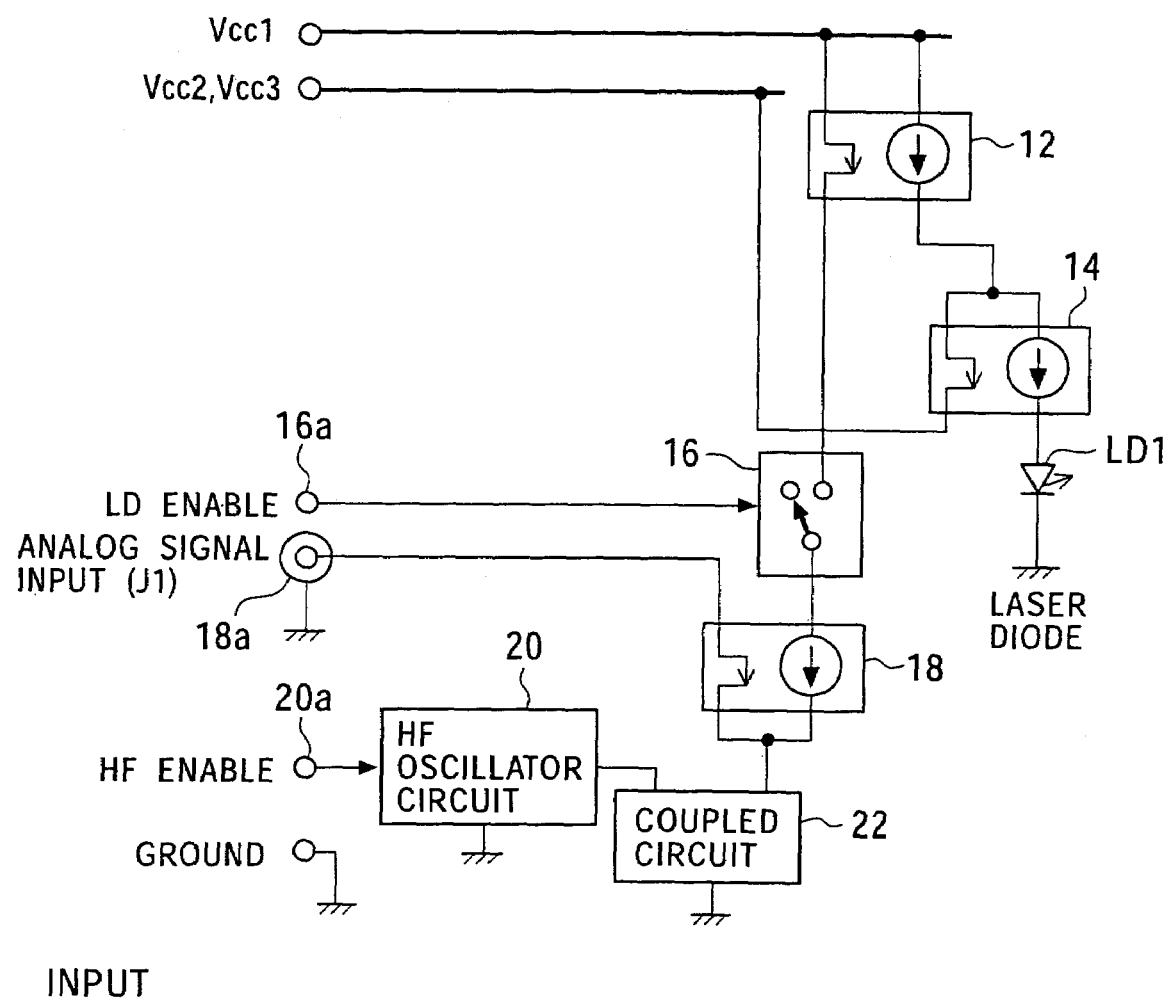
FIG. 1 is a block diagram showing the configuration of a laser driver for one laser in a semiconductor laser drive circuit of the present invention.
Figure 2:
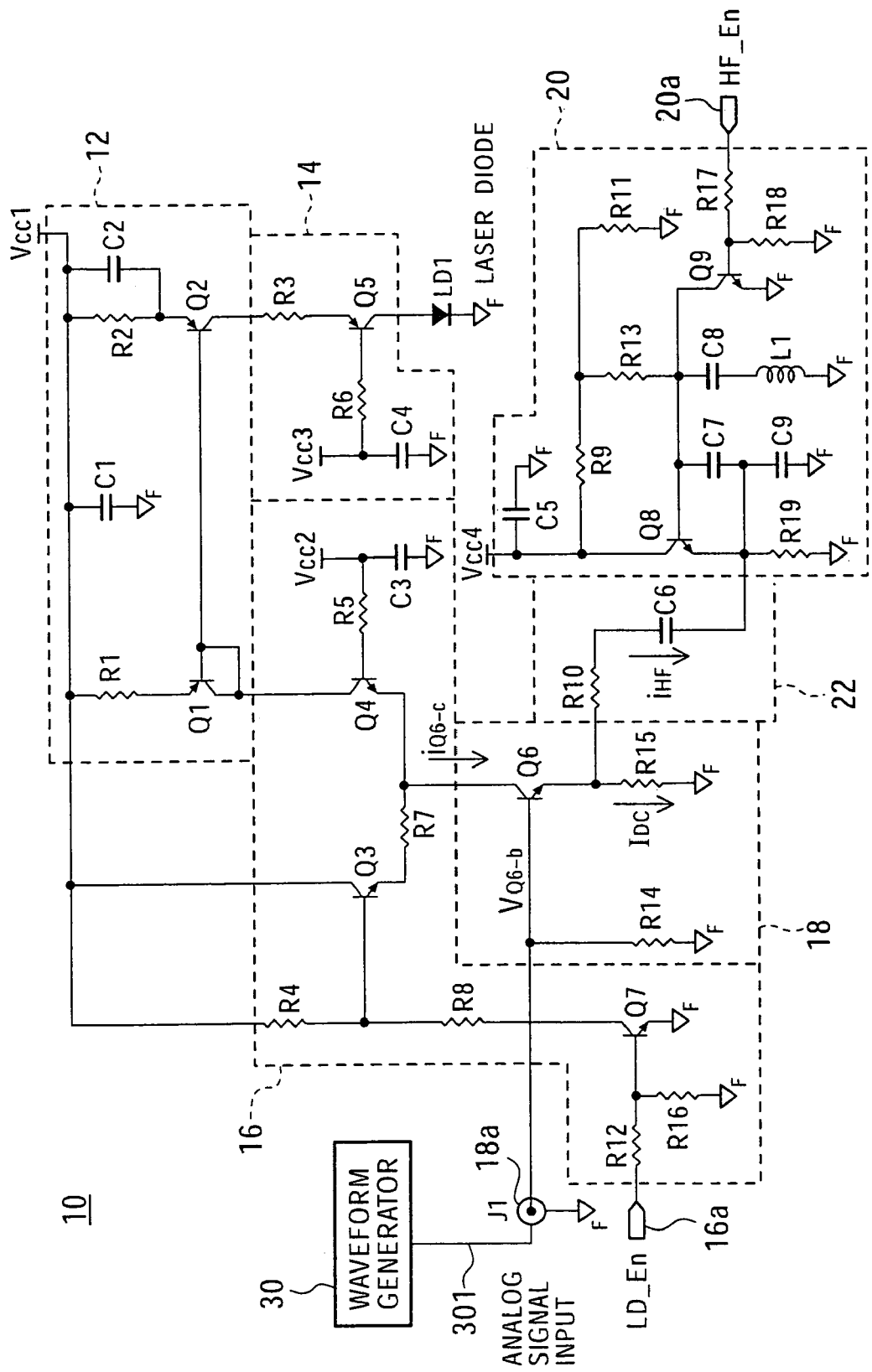
FIG. 2 is a circuit diagram showing an example of the circuit configuration of the laser driver shown in FIG. 1.

FIG. 1 is a block diagram showing the configuration of a laser driver for one laser in a semiconductor laser drive circuit of the present invention. FIG. 2 is a circuit diagram showing an example of the circuit configuration of the laser driver shown in FIG. 1.

Referring to FIGS. 1 and 2, a semiconductor laser drive circuit 10 includes a current mirror circuit 12, a common base circuit 14, a current switch circuit 16, a common emitter circuit (voltage-to-current converter circuit) 18, and a high frequency (HF) oscillator circuit 20.

The current mirror circuit 12 is used to supply current to a laser diode LD1 to cause the laser diode LD1 to emit light when a write mode and an erase mode are selected. The current mirror circuit 12 includes base-coupled PNP transistors Q1 and Q2, resistors R1 and R2, and a capacitor C2. The emitters of the transistors Q1 and Q2 are connected to power supply Vcc1 via the resistors R1 and R2, and the capacitor C2 is connected in parallel to the resistor R2.

The common base circuit 14 is used to supply current to the laser diode LD1 to drive the laser diode LD1 to emit light. The common base circuit 14 includes a PNP transistor Q5, resistors R3 and R6, and a capacitor C4. The emitter of the transistor Q5 is connected via the resistor R3 to the collector of the transistor Q2 of the current mirror circuit 12. The laser diode LD1 is connected between the collector of the transistor Q5 and ground. The base of the transistor Q5 is connected to power supply Vcc3 via the resistor R6.

The current switch circuit 16 is used to control on/off of the laser diode LD1. The current switch circuit 16 includes emitter-coupled NPN transistors Q3 and Q4 whose emitters are connected with each other via a resistor R7; resistors R4 and R8, which are connected to the base of the transistor Q3; a resistor R5 and a capacitor C3, which are connected to the base of the transistor Q4; and a switching transistor Q7 and resistors R12 and R16, which are connected to the base of the transistor Q3. The collector of the transistor Q3 is directly coupled to power supply Vcc1. The collector of the transistor Q4 is connected to the collector and base of the transistor Q1 of the current mirror circuit 12. The base of the transistor Q4 is connected to power supply Vcc2 via the resistor R5.

An input terminal 16a for inputting a laser diode enable signal LD_En is connected via a resistor R12 to the base of the transistor Q7.

The common emitter circuit 18 includes an NPN transistor Q6 and resistors R14 and R15. The base of the transistor Q6 is connected to an analog signal input terminal 18a. To the analog signal input terminal 18a, an electrical signal output from a waveform generator 30, namely, an analog signal J1, is supplied via a single-system line 301.

The collector of the transistor Q6 is commonly connected to the emitters of the transistors Q3 and Q4 of the current switch circuit 16. The emitter of the transistor Q6 is connected to an output port of the HF oscillator circuit 20 via a coupled circuit 22 including a resistor R10 and a capacitor C6.

The HF oscillator circuit 20 is used to oscillate an HF current at 200 MHz to 600 MHz to be superimposed on a drive current for the laser diode LD1 to prevent degradation of the C/N ratio of a read signal. The HF oscillator circuit 20 includes NPN transistors Q8 and Q9, resistors R9, R11, R13, and R17 to R19, capacitors C5 and C7 to C9, and a coil L1. The collector of the transistor Q8 is connected to power supply Vcc4. An HF_En input terminal 20a for inputting an HF_En signal, which is an HF superimposing on/off signal, is connected to the base of the transistor Q9.

The operation of the semiconductor laser drive circuit of this embodiment, which is arranged as described above, will now be described.

The operation of reading information from an optical disk will now be described.

The voltage signal J1 applied to the analog signal input terminal 18a is input to the base of the transistor Q6 of the common emitter circuit 18.

At the same time, the HF superimposing on/off signal, which is supplied to the HF_En input terminal 20a of the HF oscillator circuit 20 when reading information, is set to the "L" level. Thus, the transistor Q9 is turned off, and the transistor Q8 is turned on. As a result, the HF oscillator circuit 20 starts oscillating, and an output signal of the HF oscillator circuit 20 is input via the resistor R10 to the emitter of the transistor Q6 of the common emitter circuit 18. A current signal consisting of the sum of the HF oscillation signal and the voltage signal J1 flows through the collector of the transistor Q6. Since the voltage signal J1 applied to the analog signal input terminal 18a is a direct voltage, a current iQ6-C flows through the collector of the transistor Q6. The current iQ6-C is expressed by:

$$i_{Q6\text{-}c} \approx I_{DC} + i_{HF} \tag{1}$$

IDC and iHF are expressed by:

$$I_{DC} \approx \frac{V_{Q6\text{-}b} - V_{Q6\text{-}be}}{R_{15}} \tag{2}$$

$$i_{HF} \approx \frac{v_{Q8\text{-}e}}{R_{10}}$$

where VQ6-b is the base voltage of the transistor Q6, VQ6-be is the base-emitter voltage of the transistor Q6, and VQ8-e is the amplitude voltage of the emitter of the transistor Q8.

When the laser diode enable signal LD_En supplied to the input terminal 16a of the current switch circuit 16 when reading information is at the "H" level, the transistor Q7 is turned on. Thus, the transistor Q3 is turned off, and the transistor Q4 is turned on. As a result, the current signal iQ6-c flows through the transistor Q4 of the current switch circuit 16. The current mirror circuit 12 starts operating and outputs a current signal in proportion to the input signal. This current signal is supplied via the common base circuit 14 to the laser diode LD1. Accordingly, the laser diode LD1 is turned on, and an optical disk (not shown) is irradiated with laser light with an intensity associated with the current signal. On the basis of light reflected from the optical disk, information is read.

When the laser diode enable signal LD_En supplied to the input terminal 16a of the current switch circuit 16 is at the "L" level, the transistor Q7 is turned off. Thus, the transistor Q3 is turned on, and the transistor Q4 is turned off. As a result, the current signal iQ6-c flows from power supply Vcc1 through the transistor Q3 and the resistor R7 to the collector of the transistor Q6. The current mirror circuit 12 stops operating, and the laser diode LD1 is turned off.

With reference to FIG. 1, the operation of writing and erasing information on a rewritable optical disk will now be described.

The voltage signal J1 applied to the analog signal input terminal 18a is input to the base of the transistor Q6 of the common emitter circuit 18.

At the same time, the HF superimposing on/off signal, which is supplied to the HF_En input terminal 20a of the HF oscillator circuit 20 when writing and erasing information, is set to the "H" level. Thus, the transistor Q9 is turned on, and the transistor Q8 is turned off. The HF oscillator circuit 20 stops operating, and an output of the HF oscillator circuit 20 is 0 volts. In this case, a current signal consisting of the sum of the HF oscillation signal and the voltage signal J1 flows through the collector of the transistor Q6 of the common emitter circuit 18. Since the oscillation amplitude of the HF oscillator circuit 20 is zero and a direct voltage is applied to the input terminal 18a, a current iQ6-C flows through the collector of the transistor Q6. This current iQ6-C is expressed by:

$$i_{Q6\text{-}c} \approx I_{DC} \quad (3)$$

IDC is expressed by:

$$I_{DC} \approx \frac{V_{Q6-b} - V_{Q6-be}}{R_{15}} \quad (4)$$

where VQ6-b is the base voltage of the transistor Q6, and VQ6-be is the base-emitter voltage of the transistor Q6.

When the laser diode enable signal LD_En supplied to the input terminal 16a of the current switch circuit 16 when writing and erasing information is at the "H" level, the transistor Q7 is turned on. Thus, the transistor Q3 is turned off, and the transistor Q4 is turned on. As a result, the current signal iQ6-c flows through the transistor Q4 of the current switch circuit 16. The current mirror circuit 12 starts operating and outputs a current signal in proportion to the input signal. This current signal is supplied via the common base circuit 14 to the laser diode LD1. Accordingly, the laser diode LD1 is turned on, and an optical disk (not shown) is irradiated with laser light with an intensity associated with the current signal. The heat of the laser light changes a writing layer of the optical disk to a crystallized state or an amorphous state, thus rewriting data.

When the laser diode enable signal LD_En supplied to the input terminal 16a of the current switch circuit 16 is at the "L" level, the transistor Q7 is turned off. Thus, the transistor Q3 is turned on, and the transistor Q4 is turned off. As a result, the current signal iQ6-c flows from power supply Vcc1 through the transistor Q3 and the resistor R7 to the collector of the transistor Q6. The current mirror circuit 12 stops operating, and the laser diode LD1 is turned off.

According to the semiconductor laser drive circuit of this embodiment, the common emitter circuit 18 with a single-system analog signal input converts the voltage signal J1 input at the analog signal input terminal 18a into a current signal, and a signal output from the HF oscillator circuit 20 when reading information is input to the emitter of the transistor Q6 to be added to the current signal of the common emitter circuit 18. High frequency components of the signal J1 within the bandwidth of the transistor Q6 are boosted. In contrast, when viewed from the output port of the HF oscillator circuit 20, the transistor Q6 functions as a common base circuit. Thus, degradation of the output signal of the HF oscillator circuit 20 is kept at a minimum.

The current switch circuit 16 is used to cut off or let through current to the current mirror circuit 12 at the subsequent stage to cut off or output the output current of the current mirror circuit 12. When the current switch circuit 16 selects the current mirror circuit 12, the transistor Q4 becomes equivalent to a common base circuit, thus reducing the Miller effect of the transistor Q6. The current mirror circuit 12 is used to reverse the direction of current obtained at the transistor Q6 (or transistor Q4) (from Sink to Source). The common base circuit including the transistor Q5 reduces the effect of the differential resistance of the semiconductor laser, which changes in accordance with the flowing current. Particularly in the case of a low-current drive type, the Miller effect of the transistor Q2 due to an increase in the differential resistance of the semiconductor laser is reduced.

Figure 3:
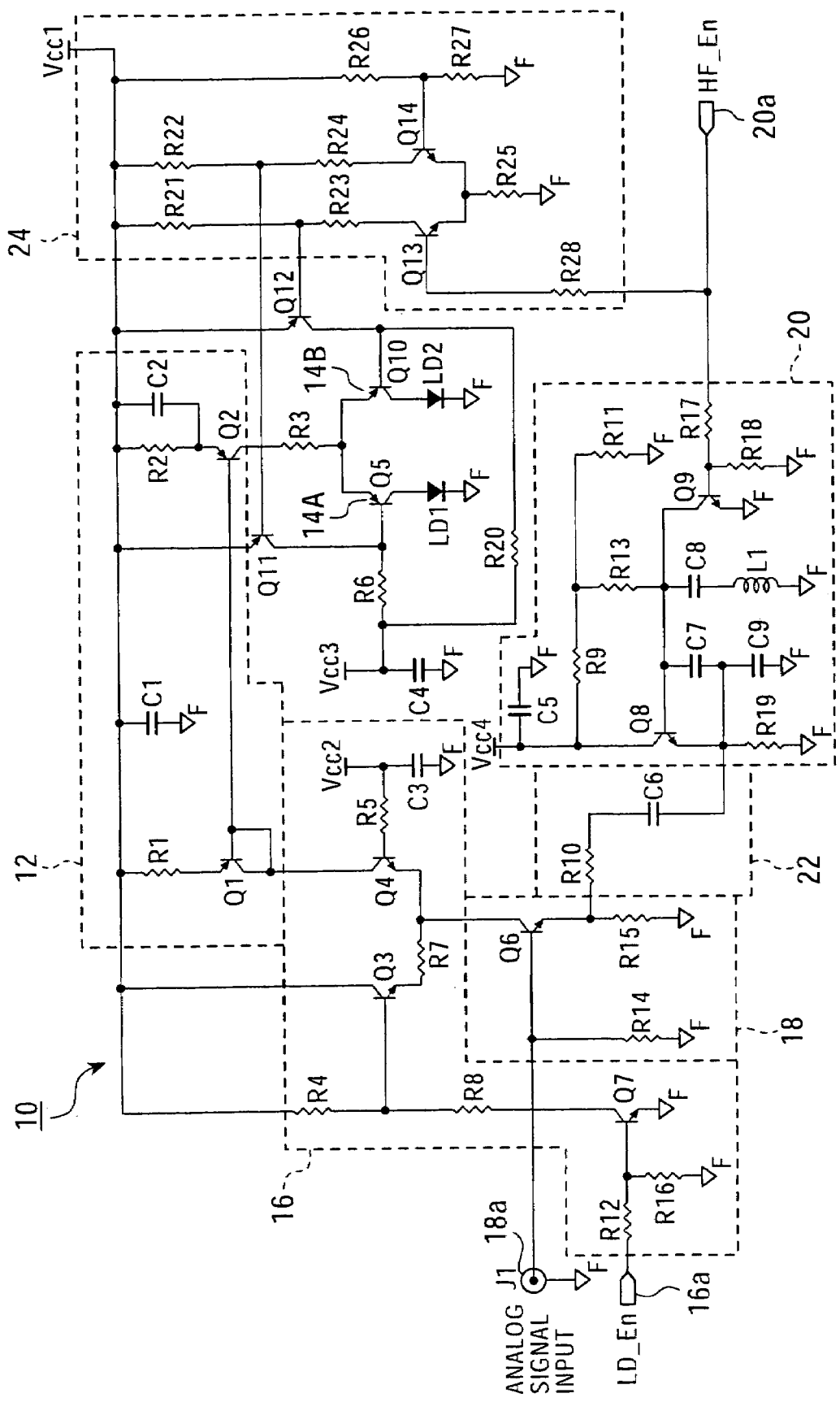
FIG. 3 is a circuit diagram showing the circuit configuration of a laser driver for two lasers according to another embodiment of the present invention.

Referring to FIG. 3, another embodiment of a semiconductor laser drive circuit according to the present invention will now be described.

FIG. 3 is a circuit diagram showing the circuit configuration of a laser driver for two lasers according to this embodiment of the present invention.

Referring to FIG. 3, a semiconductor laser drive circuit 10 includes a current mirror circuit 12, a current switch circuit 16, a common emitter circuit 18, an HF oscillator circuit 20, and a coupled circuit 22, which are arranged similarly as those shown in FIG. 2. The semiconductor laser drive circuit 10 further includes a first common base circuit 14A for supplying current from the current mirror circuit 12 to a writing/erasing laser diode LD1, a second common base circuit 14B for supplying current from the current mirror circuit 12 to a reading laser diode LD2, and a switching circuit 24 for switching a current path between the first common base circuit 14A and the second common base circuit 14B.

The first common base circuit 14A includes a PNP transistor Q5. The emitter of the transistor Q5 is connected via a resistor R3 to the collector of a transistor Q2 of the current mirror circuit 12. The writing/erasing laser diode LD1 is connected between the collector of the transistor Q5 and ground. The base of the transistor Q5 is connected to power supply Vcc3 via a resistor R6 and to ground via a capacitor C4. The collector and emitter of a transistor Q11 for controlling on/off of the transistor Q5 are connected between the base of the transistor Q5 and power supply Vcc1.

The second common base circuit 14B includes a PNP transistor Q10. The emitter of the transistor Q10 is connected via the resistor R3 to the collector of the transistor Q2 of the current mirror circuit 12. The reading laser diode LD2 is connected between the collector of the transistor Q10 and ground. The base of the transistor Q10 is connected to power supply Vcc3 via a resistor R20 and to ground via the capacitor C4. The collector and emitter of a transistor Q12 for controlling on/off of the transistor Q10 are connected between the base of the transistor Q10 and power supply Vcc1.

The switching circuit 24 includes emitter-coupled transistors Q13 and Q14 whose emitters are connected to ground via a common resistor R25.

The collector of the transistor Q13 is connected to power supply Vcc1 via resistors R21 and R23. The node between the resistors R21 and R23 is connected to the base of the transistor Q12. An HF_En input terminal 20a for inputting an HF_En signal, which is an HF superimposing on/off signal, is connected to the base of the transistor Q13 via a resistor R28.

The collector of the transistor Q14 is connected to power supply Vcc1 via resistors R22 and R24. The node between the resistors R22 and R24 is connected to the base of the transistor Q11. Bias resistors R26 and R27 are connected to the base of the transistor Q14.

The operation of such a semiconductor laser drive circuit when reading, writing, and erasing information on an optical disk is basically the same as that shown in FIG. 2. This operation differs from that shown in FIG. 2 in that the switching circuit 24 switches the current path between a path from the current mirror circuit 12 to the first common base circuit 14A and a path from the current mirror circuit 12 to the second common base circuit 14B in accordance with "H" and "L" of the HF_En signal, which is the HF superimposing on/off signal.

Specifically, when the HF_En signal is set to the "L" level when reading information, the transistor Q13 of the switching circuit 24 is turned off, and the transistor Q14 is turned on. Thus, the transistor Q12 is turned on and electrically connected to the transistor Q10 of the second common base circuit 14B. A current signal form the current mirror circuit 12 is supplied via the transistor Q10 to the reading laser diode LD2. Accordingly, the laser diode LD2 is turned on, and an optical disk (not shown) is irradiated with laser light with an intensity associated with the current signal. On the basis of light reflected from the optical disk, information is read.

Since the HF_En signal is set to the "H" level when writing and erasing information, the transistor Q13 of the switching circuit 24 is turned on, and the transistor Q14 of the switching circuit 24 is turned off. Thus, the transistor Q12 is turned on and electrically connected to the transistor Q5 of the first common base circuit 14A. The current mirror circuit 12 outputs a current signal in proportion to the input signal. This current signal is supplied via the transistor Q5 to the writing/erasing laser diode LD1. Accordingly, the laser diode LD1 is turned on, and data is written to or erased from the optical disk, that is, data is rewritten, using the "phase-change" technology.

Figure 4:
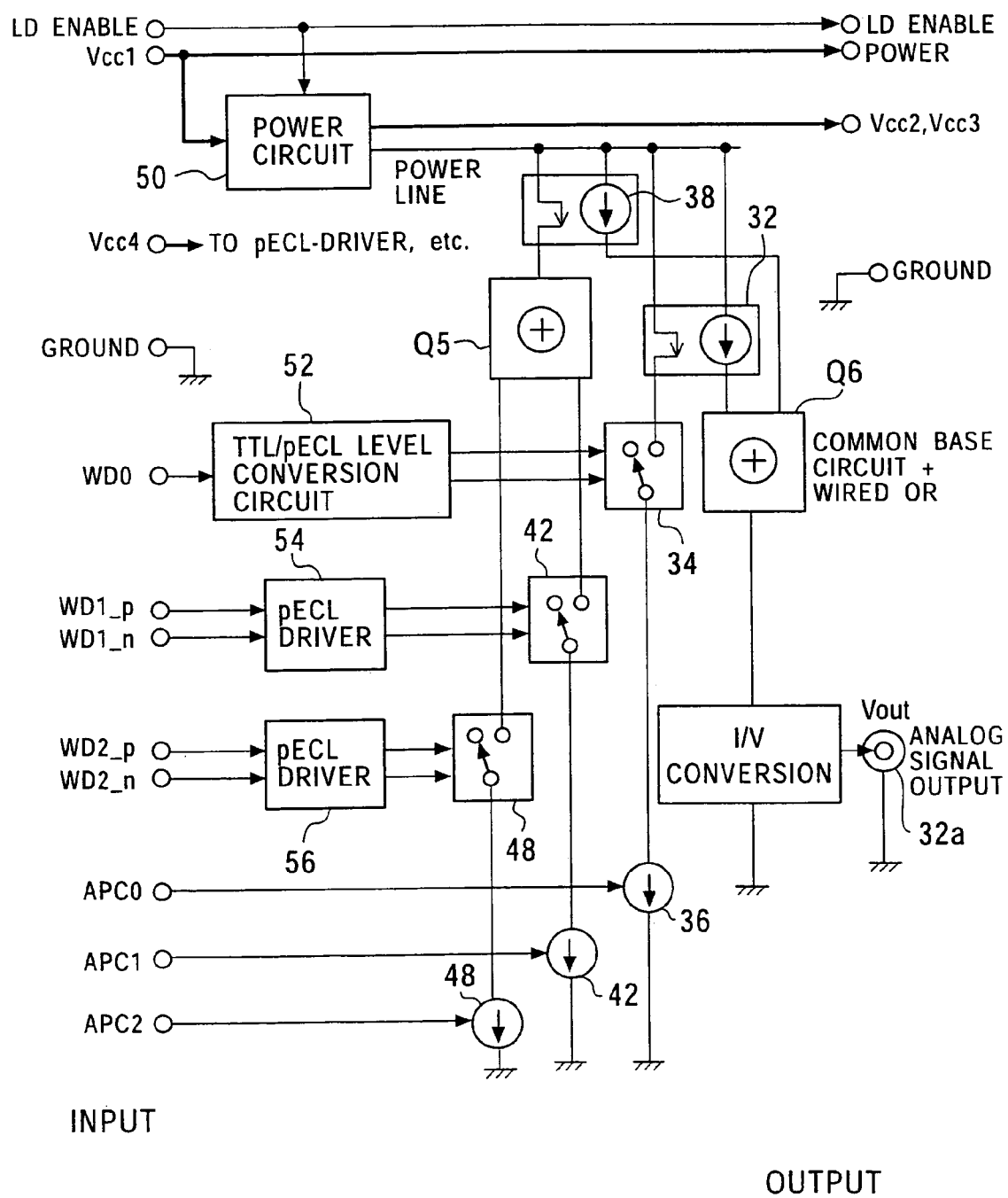
FIG. 4 is a block diagram showing the configuration of a waveform generator in the semiconductor laser drive circuit of the present invention.
Figure 5:
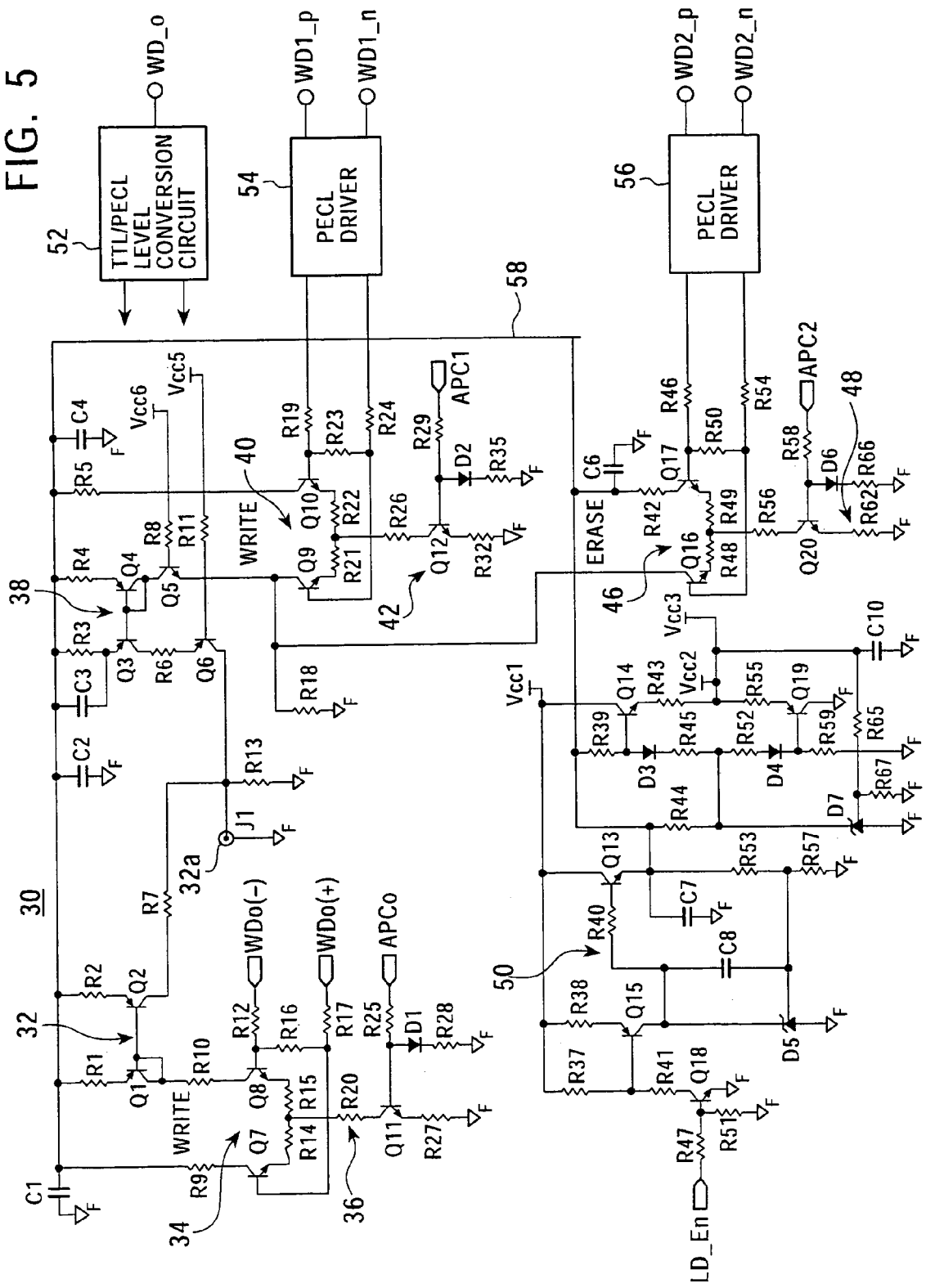
FIG. 5 is a circuit diagram showing an example of the circuit configuration of the waveform generator shown in FIG. 4.

Referring to FIGS. 4 and 5, the waveform generator for use in the semiconductor laser drive circuit of the present invention will now be described. FIG. 4 is a block diagram showing the configuration of the waveform generator in the semiconductor laser drive circuit of the present invention. FIG. 5 is a circuit diagram showing an example of the circuit configuration of the waveform generator shown in FIG. 4.

Referring to FIGS. 4 and 5, the waveform generator 30 includes a current mirror circuit 32, a current switch circuit 34, and a common emitter circuit (voltage-controlled current source) 36, which are for reading information; a current mirror circuit 38, a current switch circuit 40, and a common emitter circuit (voltage-controlled current source) 42, which are for writing and erasing information; a current switch circuit 46 and a common emitter circuit (voltage-controlled current source) 48, which are for erasing information; a bias voltage generating power supply circuit 50; a TTL/pECL level conversion circuit 52; a first pECL driver 54; and a second pECL driver 56.

The reading current mirror circuit 32 includes base-coupled PNP transistors Q1 and Q2. The emitters of the transistors Q1 and Q2 are connected to a power line 58 of the power supply circuit 50 via resistors R1 and R2, respectively. A resistor R13 for converting the collector current of the transistor Q2 into voltage is connected via a resistor R7 between the collector of the transistor Q2 and ground. An output terminal 32a for transmitting output voltage Vout for supplying a single-system analog signal to the semiconductor laser drive circuit 10 shown in FIG. 2 or FIG. 3 is connected to the node between the resistor R13 and the resistor R7.

The reading current switch circuit 34 includes emitter-coupled NPN transistors Q7 and Q8 whose emitters are connected to each other via resistors R14 and R15. The collector of the transistor Q7 is connected to the power line 58 via a resistor R9. The collector of the transistor Q8 is connected to the collector and base of the transistor Q1 of the current mirror circuit 32 via a resistor R10. The TTL/pECL level conversion circuit 52 inputs a signal WD0(−) and a signal WD0(+) to the bases of the transistors R7 and R8 via resistors R12 and R17, respectively.

The reading common emitter circuit (voltage-controlled current source) 36 includes an NPN transistor Q11, resistors R25, R27, and R28, and a diode D1. The collector of the transistor Q11 is connected to the bases of the transistors Q7 and Q8 of the current switch circuit 34 via a resistor R20. A power control signal APC0 is input to the base of the transistor Q11 via the resistor R25.

The writing current mirror circuit 38 includes base-coupled PNP transistors Q3 and Q4. The emitter of the transistor Q3 is connected to the power line 58 of the power supply circuit 50 via a parallel circuit including a resistor R3 and a capacitor C3. The emitter of the transistor Q4 is connected to the power line 58 of the power supply circuit 50 via a resistor R4. The collector of the transistor Q3 is connected to the output terminal 32a via a resistor R6 and a PNP transistor Q6 included in a common base circuit. The base of the transistor Q6 is connected to power supply Vcc5 via a resistor R11.

The collector of the transistor Q4 is connected in series to an NPN transistor Q5 included in a common base circuit. The base of the transistor Q5 is connected to power supply Vcc6 via the resistor R8.

The writing current switch circuit 40 includes emitter-coupled NPN transistors Q9 and Q10 whose emitters are connected to each other via resistors R21 and R22. The collector of the transistor Q9 is connected to the emitter of the transistor Q5. The collector of the transistor Q10 is connected to the power line 58 via a resistor R5. The first pECL driver 54 inputs a signal WD1_p and a signal WD_n to the bases of the transistors Q9 and Q10 via resistors R24 and R19, respectively. The node between the collector of the transistor Q9 and the emitter of the transistor Q5 is connected to ground via a resistor R18 for generating idle current.

The reading common emitter circuit (voltage-controlled current source) 42 includes an NPN transistor Q12, resistors R29, R32, and R36, and a varistor D2. The collector of the transistor Q12 is connected to the node between the resistors R21 and R22 of the current switch circuit 40 via a resistor R26. A power control signal APC1 is input to the base of the transistor Q12 via the resistor R29. A series circuit including the diode D2 and the resistor R36 is disposed between the base of the transistor R12 and ground.

The erasing current switch circuit 46 includes emitter-coupled NPN transistors Q16 and Q17 whose emitters are connected to each other via resistors R48 and R49. The collector of the transistor Q16 is connected to the node between the collector of the transistor Q9 and the emitter of the transistor Q5. The collector of the transistor Q17 is connected to the power line 58 via a resistor R42. The second PECL driver 56 inputs a signal WD2_p and a signal WD2_n to the bases of the transistors Q16 and Q17 via resistors R54 and R46, respectively.

The reading common emitter circuit (voltage-controlled current source) 48 includes an NPN transistor Q20, resistors R58, R62, and R66, and a diode D6. The collector of the transistor Q20 is connected to the node between the resistors R48 and R49 of the current switch circuit 46 via a resistor R56. A power control signal APC2 is input to the base of the transistor Q20 via a resistor R58. A series circuit including the diode D6 and the resistor R66 is disposed between the base of the transistor Q20 and ground.

The bias voltage generating power supply circuit 50 includes transistors Q13, Q14, Q15, Q18, and Q19; resistors R37 to R41, R43 to R45, R47, R51 to R53, R55, R57, R59, R65, and R67; diodes D3 and D4; Zener diodes D5 and D7; and capacitors C7, C8, and C10. A laser diode enable signal LD_En is input to the base of the transistor Q18.

The operation of the waveform generator 30 arranged as described above will now be described.

The operation of reading information will now be described.

In response to the power control signals APC0 to APC2, necessary bias voltages are applied to the corresponding common emitter circuits (voltage-controlled current sources) 36, 42, and 48. In response, currents are generated at the collectors of the transistors Q11, Q12, and Q20 of these common emitter circuits (voltage-controlled current sources) 36, 42, and 48. The generated current signals are input to the corresponding current switch circuits 34, 40, and 46.

In response to a signal from the TTL/pECL level conversion circuit 52, the transistor Q7 is turned off, and the transistor Q8 is turned on. Thus, the reading current switch circuit 34 selects the current mirror circuit 32. The current IR is transmitted to the current mirror circuit 32.

In contrast, in response to a signal from the corresponding first pECL driver 54, the transistor Q9 is turned off, and the transistor Q10 is turned on. Thus, the writing current switch circuit 40 selects the power supply side. In response to a signal from the corresponding second pECL driver 56, the transistor Q16 is turned off, and the transistor Q17 is turned on. Thus, the erasing current switch circuit 46 selects the power supply side. As a result, the currents $I_W$ and $I_e$ are not transmitted to the current mirror circuit 38. Assume A is the input/output coupling constant of the reading, writing, and erasing current mirror circuits 32, 38, and 44. The combined current IOUT output from the waveform generator 30 is expressed by:

$$I_{OUT} = A \cdot I_R + A \cdot I_{bias} \quad (5)$$

where Ibias is the idle current generated by the resistor R18 for always activating the writing and erasing current mirror circuit 38.

In a case where the waveform generator 30 is coupled to the semiconductor laser drive circuit 10, when the output of the laser drive circuit 10 is less than a threshold current of the semiconductor laser, the idle current has no influence on controlling the laser power.

The output voltage VOUT when the waveform generator 30 is connected with the semiconductor laser drive circuit is expressed by:

$$V_{OUT} = \frac{R_{18} \cdot Z_{in}}{R_{18} + Z_{in}} \cdot A \cdot (I_R + I_{bias}) \quad (6)$$

where Zin is the input impedance of the semiconductor laser drive circuit.

The operation of writing information will now be described.

In response to the power control signals APC01 to APC02, necessary bias voltages are applied to the corresponding common emitter circuits (voltage-controlled current sources) 36, 42, and 48. In response, currents are generated at the collectors of the transistors Q11, Q12, and Q20 of these common emitter circuits (voltage-controlled current sources) 36, 42, and 48. The generated current signals are input to the corresponding current switch circuits 34, 40, and 46.

When writing information, in response to a signal from the TTL/pECL level conversion circuit 52, the transistor Q7 is turned off, and the transistor Q8 is turned on. Thus, the reading current switch circuit 34 selects the current mirror circuit 32. The current IR is transmitted to the current mirror circuit 32.

Figure 6:
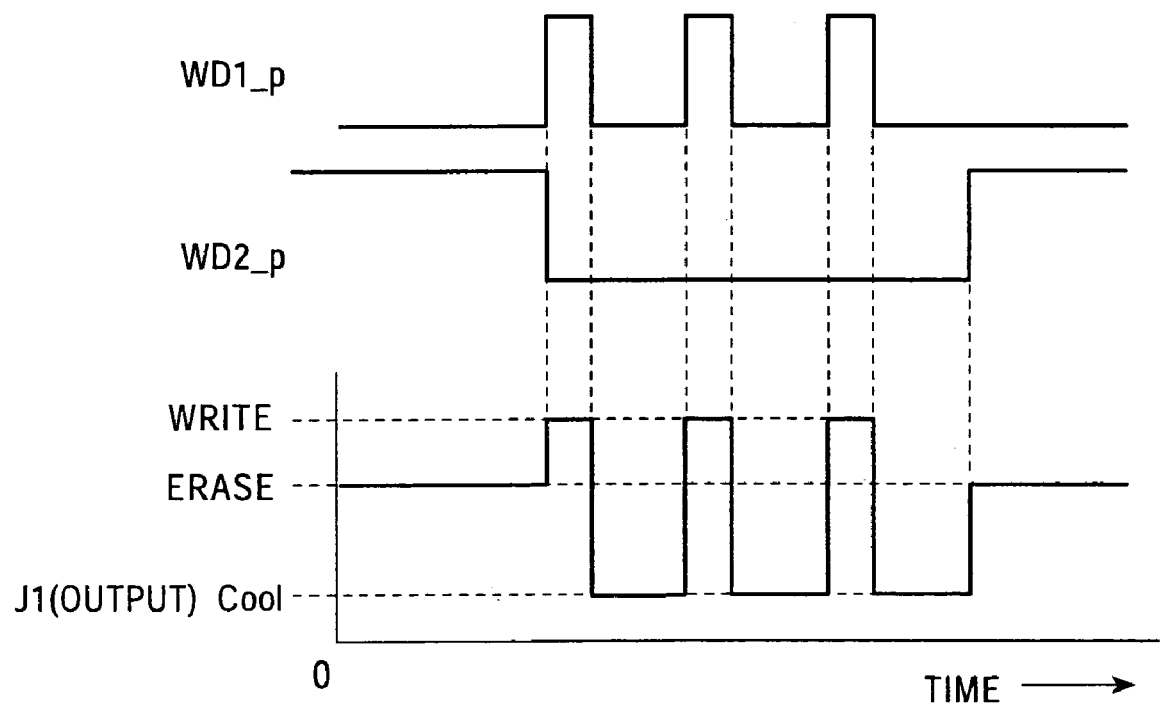
FIG. 6 is a descriptive timing chart of the waveform generator of the present invention.

In contrast, in response to signals (binary pulses) from the corresponding first pECL driver 54 and the second pECL driver 56, the current path is switched between the power supply and the writing and erasing current mirror circuit 38 in accordance with the timing shown in FIG. 6. The currents $I_W$ and $I_e$ are transmitted as pulse currents to the current mirror circuit. Assume $\hat{I}_W$ and $\hat{I}_e$ are the pulsed currents of $I_W$ and $I_e$, and A is the input/output coupling constant of the reading, writing, and erasing current mirror circuits 32, 38, and 44. The current IOUT flowing into the resistor R13 is expressed by:

$$I_{OUT} = A \cdot I_R + A \cdot (I_{bias} + \hat{I}_W + \hat{I}_e) \quad (7)$$

$$\hat{I}_W = \begin{cases} I_W & (WD^1\_p = \text{"H"}) \\ 0 & (WD^1\_p = \text{"L"}) \end{cases}$$

$$\hat{I}_e = \begin{cases} I_e & (WD^2\_p = \text{"H"}) \\ 0 & (WD^2\_p = \text{"L"}) \end{cases}$$

where Ibias is the idle current generated by the resistor R18 for always activating the writing and erasing current mirror circuit 38.

In a case where the waveform generator 30 is coupled to the semiconductor laser drive circuit 10, when the output of the laser drive circuit 10 is less than the threshold current of the semiconductor laser, the idle current has no influence on controlling the laser power. The current $I_R$ for writing information contributes to controlling the cooling power.

The output voltage VOUT when the waveform generator 30 is connected with the semiconductor laser driver is expressed by:

$$V_{OUT} = \frac{R_{18} \cdot Z_{in}}{R_{18} + Z_{in}} \cdot A \cdot (I_R + I_{bias} + \hat{I}_W + \hat{I}_e) \quad (8)$$

where Zin is the input impedance of the semiconductor laser drive circuit 10.

The operation of erasing information will now be described.

In response to the power control signals APC0 to APC2, necessary bias voltages are applied to the corresponding common emitter circuits (voltage-controlled current sources) 36, 42, and 48. In response, currents are generated at the collectors of the transistors Q11, Q12, and Q20 of these common emitter circuits (voltage-controlled current sources) 36, 42, and 48. The generated current signals are input to the corresponding current switch circuits 34, 40, and 46.

When erasing information, in response to a signal from the corresponding TTL/pECL level conversion circuit 52, the transistor Q7 is turned off, and the transistor Q8 is turned on. Thus, the reading current switch circuit 34 selects the current mirror circuit 32. The current IR is transmitted to the current mirror circuit 32. In response to a signal from the corresponding second pECL driver 56, the transistor Q16 is turned on, and the transistor Q17 is turned off. Thus, the erasing current switch circuit 46 selects the current mirror circuit 38. The current $I_e$ is transmitted to the current mirror circuit 38 via the NPN transistor Q5 included in the common base circuit.

In contrast, since a signal (WD1_1) from the corresponding first pECL driver 54 is at the "L" level, the writing current switch circuit 40 selects the power supply side. Therefore, the combined current IOUT output from the waveform generator 30 is expressed by:

$$I_{out} = A \cdot I_R + A \cdot (I_{bias} + I_e) \qquad (9)$$

where Ibias is the idle current generated by the resistor R18 for always activating the writing and erasing current mirror circuit 38.

In a case where the waveform generator 30 is coupled to the semiconductor laser drive circuit 10, when the output of the laser drive circuit 10 is less than the threshold current of the semiconductor laser, the idle current has no influence on controlling the laser power. The current IR for writing information contributes to controlling the cooling power.

The output voltage VOUT when the waveform generator 30 is connected with the semiconductor laser drive circuit 10 is expressed by:

$$V_{OUT} = \frac{R_{18} \cdot Z_{in}}{R_{18} + Z_{in}} \cdot A \cdot (I_R + I_{bias} + I_e) \qquad (10)$$

where Zin is the input impedance of the semiconductor laser drive circuit 10.

When reading, writing, and erasing information, the semiconductor laser drive circuit 10 and the waveform generator 30 are connected to each other in the actual operating state. A relational expression of the output voltage VOUT and VQ6-b in equation (4) in the description of the operation of the semiconductor laser drive circuit 10 is expressed by:

$$V_{OUT} = V_Q^{6}{}_{\text{-}b} \qquad (11)$$

The operation of turning on and off the laser diode will now be described.

When turning off the laser diode, the LD_En signal of the bias voltage generating power supply circuit 50 receives the "L" level of the TTL/CMOS level. In response, the transistor Q18 of the bias voltage generating power supply circuit 50 is turned off, and the transistor Q15 is also turned off. Since no bias current flows through the Zener diode D5, the cathode voltage of the Zener diode D5 is approximately 0 V, and the output of (emitter of) the transistor Q13 is also approximately 0 V. The output of the transistor Q13 is used as the main power source for the waveform generator 30. When this voltage is 0 V, the entire circuit is deactivated. Thus, the output current signal of the waveform generator 30 is zero.

When turning on the laser diode, the LD_En signal of the bias voltage generating power supply circuit 50 receives the "H" level of the TTL/CMOS level. In response, the transistor Q18 of the bias voltage generating power supply circuit 50 is turned on, and the transistor Q15 becomes a constant current source. Bias current flows through the Zener diode D5, and a desired reference voltage is generated at the cathode of the Zener diode D5. This reference voltage is applied to the base of the transistor Q13. There is a voltage drop of approximately 0.6 V in the output of (emitter of) the transistor Q13. Since the Zener diode D5 is a shunt regulator bandgap voltage source, the output voltage of (emitter of) the transistor Q13 controls the cathode voltage so that the reference voltage in the Zener diode D5 is equal to the voltage divided between the resistors R53 and R57, thus yielding:

$$V_{Q13-e} = \frac{R_{53} + R_{57}}{R_{57}} \cdot V_{ref} \qquad (12)$$

where Vref is the reference voltage of D5.

The output of the transistor Q13 is used as the main power source for the waveform generator 30. When this voltage becomes a sufficient voltage for the circuit operation, the laser can be turned on for reading, writing, and erasing information.

As described above, according to the semiconductor laser drive circuit of the present invention, in a disk drive for a phase-change optical disk, a drive that must be mounted on a small pickup is necessarily kept at a distance from an APC (Automatic Power Control) circuit that is relatively large. Since the laser driver is separated from the waveform generator and a signal transmission line between the two is associated with a single-system analog signal, the number of wires is reduced. This separation of the laser driver from the waveform generator solves the problem of out-of-timing pulses (WD1 and WD2) due to differences in wire length when a waveform for writing at a high transfer rate is generated.

According to the present invention, the common base circuits in the laser driver and the waveform generator contribute to reduction of the Miller effect and broadening of the bandwidth. As a result, light pulses with a short emission time at a high transfer rate are emitted.

Since the semiconductor laser drive circuit of the present invention is separated into the laser driver and the waveform generator, circuit elements other than required minimum elements are excluded out of the pickup. Accordingly, the operating current of the drive is suppressed, thus reducing heat generation. The semiconductor laser drive circuit is thus advantageous in dissipating heat.

According to the present invention, the semiconductor laser drive circuit including a pair of two components, i.e., the laser driver and the waveform generator, may be modified to selectively use two lasers. For example, the two lasers are selectively used for reading (low-noise laser) and writing (high-output laser). The choice between these two characteristics (low noise and high output) is a trade off that must be made in the manufacture of semiconductor laser chips. According to the present invention, these two characteristics are simultaneously achieved. If a two-laser-type can be realized by a single main circuit, the semiconductor laser drive circuit is applicable to two lasers with different wavelengths without a significant increase in cost. Therefore, the semiconductor laser drive circuit is applicable to a compatible optical disk recorder or a multi-wavelength-writing optical disk drive.

The invention claimed is:

1. A semiconductor laser drive circuit incorporated and used in an optical disk drive for writing, erasing, and reading information from a phase-change optical disk by irradiating the optical disk with laser light, comprising:
   a waveform generator for generating an electrical signal for generating laser light associated with writing, erasing, and reading when writing, erasing, and reading information;

a single line for outputting the electrical signal from the waveform generator; and a laser driver for driving a semiconductor laser by supplying, to the semiconductor laser, current in proportion to the electrical signal output through the single line.

2. The semiconductor laser drive circuit according to claim 1, wherein the waveform generator and the laser driver are kept at a distance from each other.

3. The semiconductor laser drive circuit according to claim 1, wherein the electrical signal output from the waveform generator is a voltage signal; the laser driver includes a voltage-to-current conversion circuit for converting the voltage signal from the waveform generator into current and a current mirror circuit driven by a current signal output from the voltage-to-current conversion circuit; and current in proportion to the voltage signal is supplied from the current mirror circuit to the semiconductor laser.

4. The semiconductor laser drive circuit according to claim 3, wherein the voltage-to-current conversion circuit includes a common emitter circuit.

5. The semiconductor laser drive circuit according to claim 3, wherein the optical disk drive sends a control signal for writing, erasing, and reading information; and whether to cut off or supply the current signal from the voltage-to-current conversion circuit to the current mirror circuit is controlled by a current switch circuit operated by the control signal.

6. The semiconductor laser drive circuit according to claim 3, wherein a common base circuit is disposed between the current mirror circuit and the semiconductor laser, and the common base circuit suppresses an impedance variation of the semiconductor laser and a bandwidth variation due to the Miller effect.

7. The semiconductor laser drive circuit according to claim 3, wherein the laser driver includes a high-frequency oscillator circuit for superimposing a high-frequency current on the current signal from the voltage-to-current conversion circuit when reading information.

8. The semiconductor laser drive circuit according to claim 1, wherein the semiconductor laser is a laser diode.

9. The semiconductor laser drive circuit according to claim 3, wherein the semiconductor laser driven by the current from the current mirror circuit includes two semiconductor lasers for reading and for writing/erasing, the two semiconductor lasers being selectively driven.

10. The semiconductor laser drive circuit according to claim 9, wherein two common base circuits are provided between the current mirror circuit and the reading laser diode and between the current mirror circuit and the writing/erasing laser diode, respectively; and a switching circuit is provided to select a current path between a current path from the current mirror circuit to one common base circuit and a current path from the current mirror circuit to the other common base circuit.

11. The semiconductor laser drive circuit according to claim 1, wherein the waveform generator includes a plurality of pulse current sources using emitter-coupled current switch circuits, and the electrical signal is a writing waveform signal generated by adding the pulse current sources.

12. The semiconductor laser drive circuit according to claim 11, wherein a common base circuit is provided at the outputs of the pulse current sources, and the pulse current sources are added at the input port of the common base circuit.

13. The semiconductor laser drive circuit according to claim 12, wherein a current mirror circuit is provided at the output of the common base circuit.

14. The semiconductor laser drive circuit according to claim 13, wherein a common base circuit is provided at the output of the current mirror circuit.

15. The semiconductor laser drive circuit according to claim 11, wherein a common base circuit is provided at the outputs of the pulse current sources, and the pulse current sources are added at the input port of the common base circuit; a current mirror circuit is provided at the output of the common base circuit, and a common base circuit is provided at the output of the current mirror circuit; and, of the pulse current sources, an output of the pulse current source not required to have high-speed response is added to the output of the current mirror circuit.

16. A recording device comprising the semiconductor laser drive circuit recited in any of claims 1–15.

17. A reproducing device comprising the semiconductor laser drive circuit recited in any of claims 1–15.

* * * * *